(12) United States Patent
Goto

(10) Patent No.: US 11,393,739 B2
(45) Date of Patent: Jul. 19, 2022

(54) HEAT DISSIPATION DEVICE FOR ELECTRONIC COMPONENT

(71) Applicant: DENSO CORPORATION, Kariya (JP)

(72) Inventor: Toshiyuki Goto, Kariya (JP)

(73) Assignee: DENSO CORPORATION, Kariya (JP)

( * ) Notice: Subject to any disclaimer, the term of this patent is extended or adjusted under 35 U.S.C. 154(b) by 149 days.

(21) Appl. No.: 17/003,796

(22) Filed: Aug. 26, 2020

(65) Prior Publication Data
US 2020/0395270 A1    Dec. 17, 2020

Related U.S. Application Data

(63) Continuation of application No. PCT/JP2019/008416, filed on Mar. 4, 2019.

(30) Foreign Application Priority Data

Mar. 8, 2018   (JP) .............................. JP2018-041773

(51) Int. Cl.
*H01L 23/433*   (2006.01)
*H01L 23/40*    (2006.01)

(52) U.S. Cl.
CPC ........ *H01L 23/433* (2013.01); *H01L 23/4093* (2013.01)

(58) Field of Classification Search
CPC .............. H01L 23/433; H01L 23/4093; H01L 23/3675; H01L 21/4878; H05K 7/20454; H05K 7/2049
USPC ....................................................... 165/80.2
See application file for complete search history.

(56) References Cited

U.S. PATENT DOCUMENTS

| 6,442,026 B2 * | 8/2002 | Yamaoka .................. G06F 1/20 |
| | | 257/E23.102 |
| 6,487,079 B2 * | 11/2002 | Katsui ................. H01L 23/4006 |
| | | 165/185 |
| 9,277,681 B2 * | 3/2016 | Kawai ................ H05K 7/20854 |
| 9,379,037 B2 * | 6/2016 | Degner ............... H01L 23/4006 |

(Continued)

FOREIGN PATENT DOCUMENTS

| JP | S58111356 A | 7/1983 |
| JP | 2003037228 A | 2/2003 |

(Continued)

*Primary Examiner* — Jon T. Schermerhorn, Jr.
(74) *Attorney, Agent, or Firm* — Harness, Dickey & Pierce, P.L.C.

(57) ABSTRACT

A heat dissipation device includes a heat diffusion plate, a resin unit, and a connecting unit. The heat diffusion plate is configured such that the first surface is overlapped with an electronic component via a heat conductive material. The resin unit integrally includes a contact portion, an outer frame portion, and a deformation portion. The contact portion is configured so that at least a part thereof can make surface contact with the second surface of the heat diffusion plate opposite from the first surface. The outer frame portion is configured to surround the contact portion with a gap from the surroundings to form a part of a housing surrounding the electronic component and the heat diffusion plate. The deformation portion is provided between the outer frame portion and the contact portion, and is configured to elastically deform when the contact portion is pressed against the second surface.

6 Claims, 9 Drawing Sheets

(56) References Cited

U.S. PATENT DOCUMENTS

| | | | | |
|---|---|---|---|---|
| 2005/0078456 A1* | 4/2005 | Mandel | ............... | H01L 23/427 |
| | | | | 257/E23.105 |
| 2007/0268671 A1* | 11/2007 | Brandenburg | ........ | H01L 25/072 |
| | | | | 257/E25.012 |
| 2009/0008771 A1* | 1/2009 | Torii | ............... | H01L 23/3675 |
| | | | | 257/E23.101 |
| 2011/0228498 A1* | 9/2011 | Kawai | ............... | H05K 7/20854 |
| | | | | 361/752 |
| 2013/0250521 A1 | 9/2013 | Kawai et al. | | |

FOREIGN PATENT DOCUMENTS

| | | | |
|---|---|---|---|
| JP | 3946670 | B2 | 7/2007 |
| JP | 2012227472 | A | 11/2012 |
| JP | 2013197405 | A | 9/2013 |
| JP | 5698894 | B2 | 4/2015 |

\* cited by examiner

HEAT DISSIPATION DEVICE FOR ELECTRONIC COMPONENT

CROSS-REFERENCE TO RELATED APPLICATION

The present application is a continuation application of International Patent Application No. PCT/JP2019/008416 filed on Mar. 4, 2019, which designated the U.S. and claims the benefit of priority from Japanese Patent Application No. 2018-41773 filed with the Japan Patent Office on Mar. 8, 2018. The entire disclosures of all of the above applications are incorporated herein by reference.

TECHNICAL FIELD

The present disclosure relates to a heat dissipation device to dissipate heat generated in an electronic component.

BACKGROUND ART

A heat dissipation device dissipates heat generated by an electronic component. The heat is radiated as electromagnetic waves to the atmosphere via the housing, or is diffused by convection of air.

SUMMARY

One aspect of the present disclosure is to provide a heat dissipation device for an electronic component, in which resin forming the housing is able to be in tight contact with a heat diffusion plate. The heat dissipation device for an electronic component includes a heat diffusion plate, a resin unit, and a connecting unit. The heat diffusion plate has the first surface overlapped on the electronic component through a heat conductive material to diffuse heat. The resin unit integrally includes a contact portion, an outer frame portion, and a deformation portion. The contact portion is configured so that at least a part thereof can come into surface contact with the second surface of the heat diffusion plate opposite from the first surface. The outer frame portion is configured to surround the contact portion with a gap from the periphery to form a part of a housing surrounding the electronic component and the heat diffusion plate. The deformation portion is provided between the outer frame portion and the contact portion, and is configured to elastically deform when the contact portion is pressed against the second surface.

DETAILED DESCRIPTION

Figure 1:
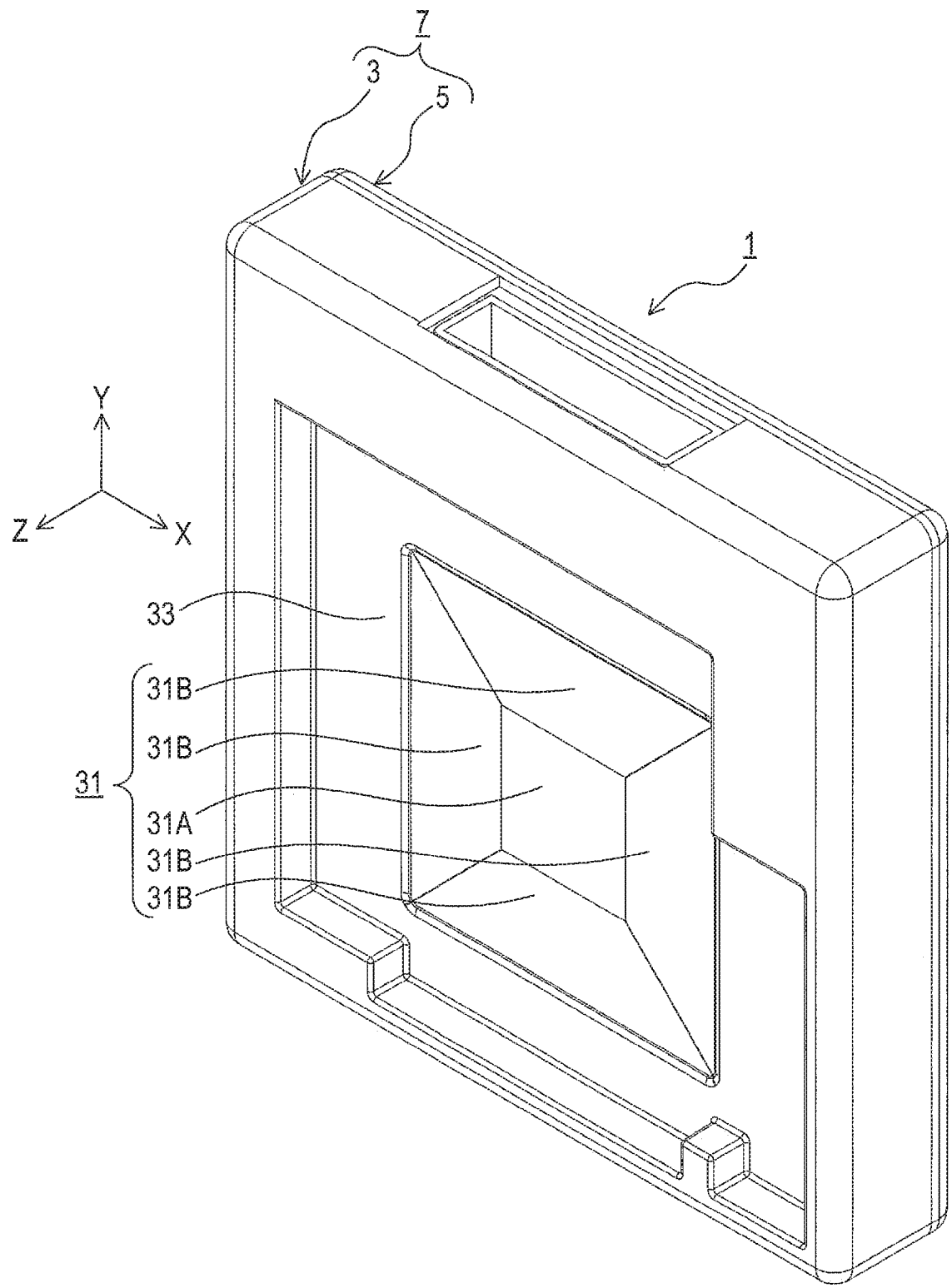
FIG. 1 is a perspective view illustrating a configuration of an electronic device according to an embodiment.

To begin with, examples of relevant techniques will be described.

It has been proposed to attach a first surface of a heat diffusion plate such as a metal plate to an electronic component such as IC chip through a heat conductive material such as a heat transfer sheet or a heat transfer gel, and to make a second surface of the heat diffusion plate to be in tight contact with a housing made of resin. If such a configuration is adopted, heat generated by the electronic components is diffused to the entire surface of the heat diffusion plate via the heat conductive material. Further, the heat is radiated as electromagnetic waves to the atmosphere via the housing made of resin, or is diffused (i.e., dissipated) by convection of air.

When such a configuration is employed, in order to improve heat dissipation, the close contact is to be ensured between the heat diffusion plate and the housing made of resin. For example, the housing is molded by being bent inward, and the bent portion is brought into close contact with the heat diffusion plate by using the elasticity of resin.

However, in case where the resin and the heat diffusion plate are brought into close contact with each other by utilizing the overall bending of the housing, the inner dimensions of the housing change during the process of elastic deformation of the housing. As a result of detailed studies by the inventor, it has been found that it is difficult to achieve high dimensional accuracy of the housing with such a configuration. Therefore, it is necessary to design the gap between the heat diffusion plate and the electronic component to be relatively large, and it is necessary to use a heat conductive material thicker. Then, there is a possibility that heat dissipation may be reduced due to an increase in the thickness of the heat conductive material. Further, it is also difficult to reduce the size of the housing itself, since it is difficult to achieve high dimensional accuracy.

One aspect of the present disclosure is to provide a heat dissipation device for an electronic component, in which resin forming the housing is able to be in tight contact with a heat diffusion plate while suppressing a decrease in dimensional accuracy of the housing.

According to an aspect of the present disclosure, a heat dissipation device for an electronic component includes a heat diffusion plate, a resin unit, and a connecting unit. The heat diffusion plate has the first surface overlapped on the electronic component through a heat conductive material to diffuse heat.

The resin unit integrally includes a contact portion, an outer frame portion, and a deformation portion. The contact portion is configured so that at least a part thereof can come into surface contact with the second surface of the heat diffusion plate opposite from the first surface. The outer frame portion is configured to surround the contact portion with a gap from the periphery to form a part of a housing surrounding the electronic component and the heat diffusion plate. The deformation portion is provided between the outer frame portion and the contact portion, and is configured to elastically deform when the contact portion is pressed against the second surface.

The connecting unit is configured to connect the heat diffusion plate to the outer frame portion such that at least a part of the contact portion comes into surface contact with the second surface due to the elastic deformation of the deformation portion.

According to such a configuration, when the heat diffusion plate having the first surface overlapped with the electronic component via the heat conductive material is connected to the outer frame portion of the resin unit by the connecting unit, at least a part of the contact portion of the resin unit comes into surface contact with the second surface of the heat diffusion plate opposite from the first surface. At this time, even if the contact portion is pressed against the second surface, the deformation portion provided between the outer frame portion and the contact portion is elastically deformed. For this reason, the outer frame portion configured to constitute a part of the housing surrounding the electronic component and the heat diffusion plate is restricted from being deformed by the force generated by the pressure contact. Therefore, it is possible to make the resin constituting the housing to be in close contact with the heat diffusion plate while suppressing a decrease in the dimensional accuracy of the housing.

In the present disclosure, "surface contact" may be a contact state with a predetermined area where the contact portion and the second surface are in contact with each other, and the width or shape of the contact area is not limited.

Hereinafter, an embodiment of the present disclosure will be described with reference to the drawings.

Figure 2:
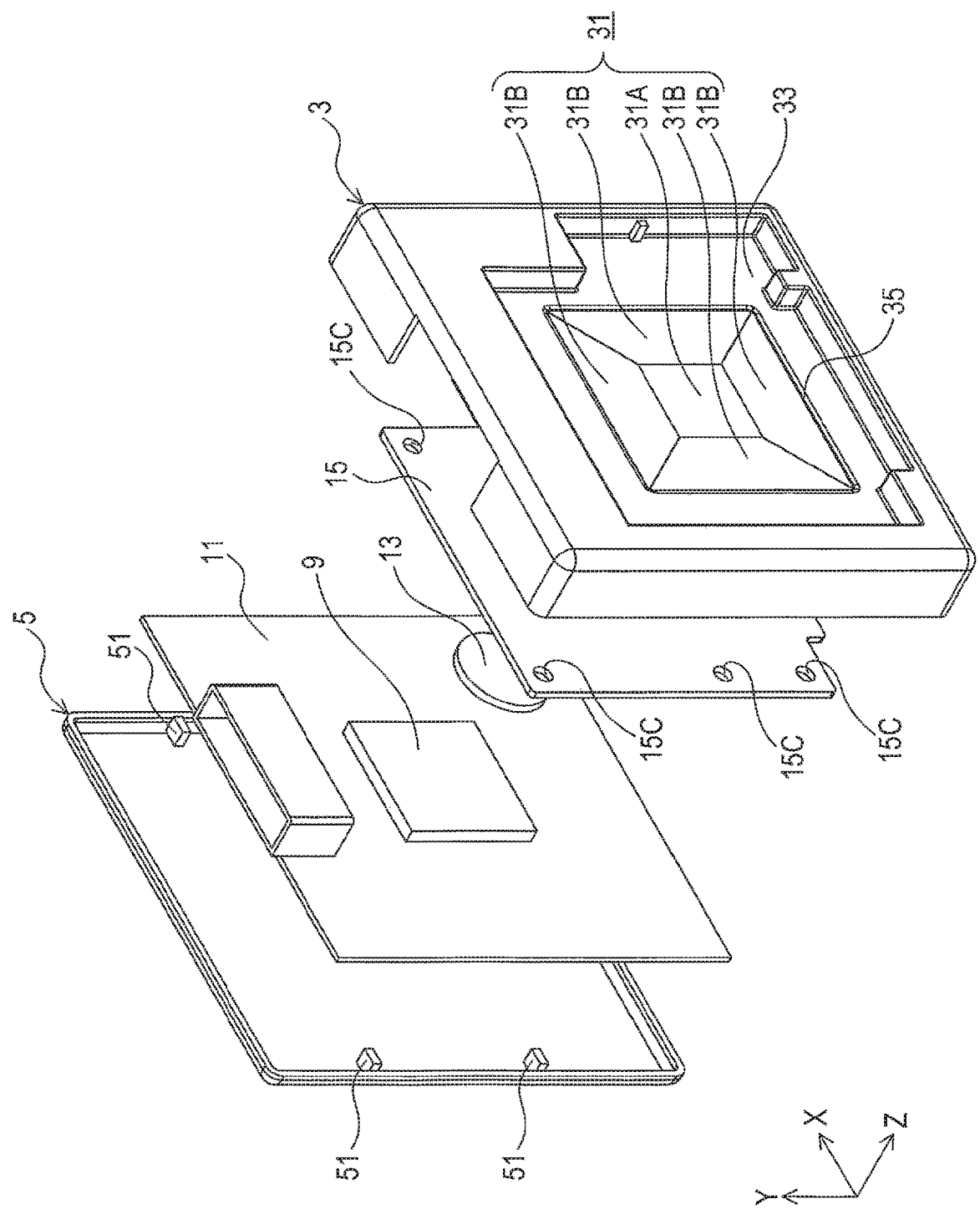
FIG. 2 is an exploded perspective view illustrating the electronic device.
Figure 3:
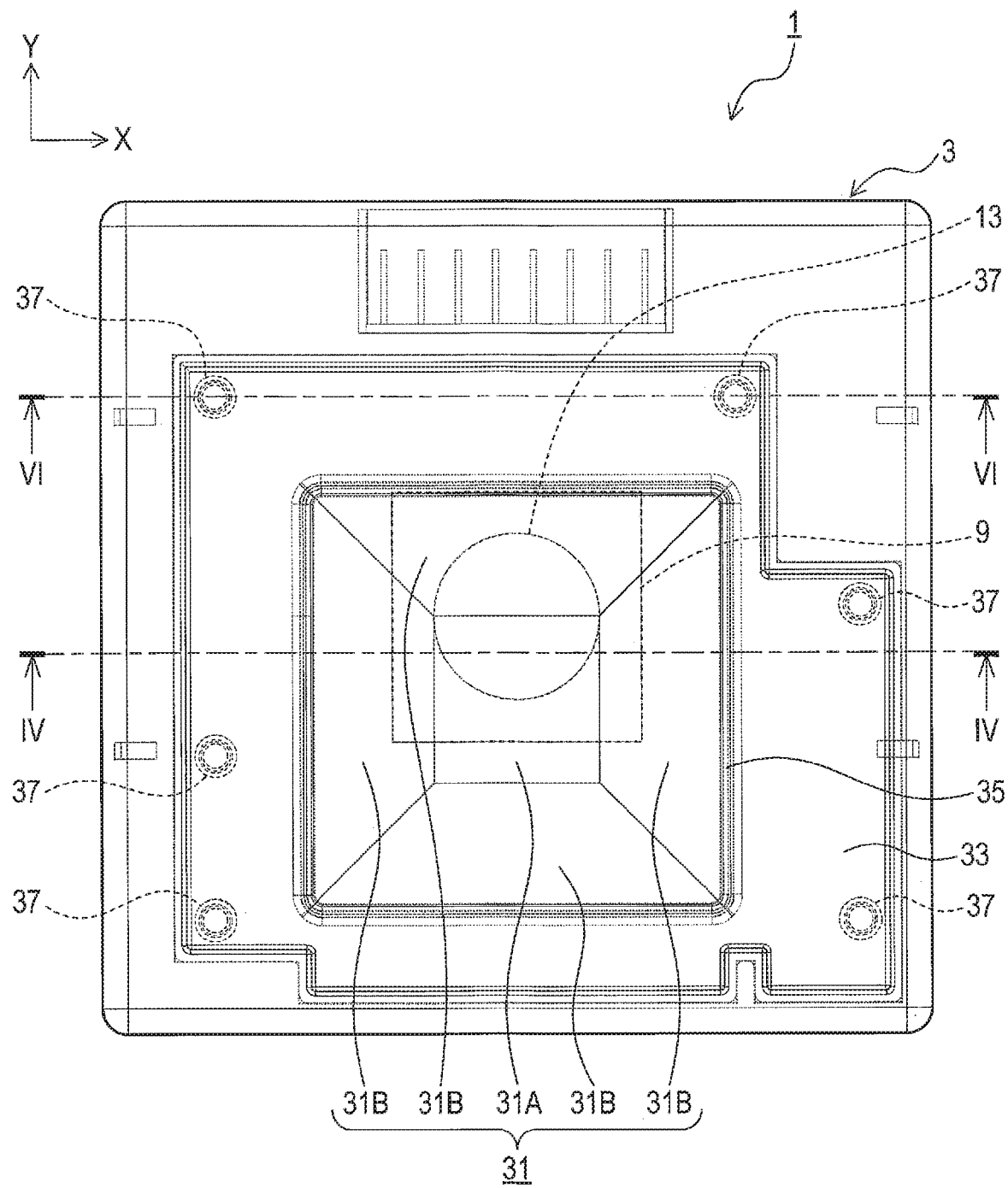
FIG. 3 is a front view illustrating the electronic device.

As shown in FIGS. 1 to 3, an electronic device 1 of the embodiment includes a printed wiring board 11 on which an IC chip 9 is mounted inside a housing 7 having a substantially rectangular parallelepiped shape with a case 3 and a cover 5. Further, a heat radiation gel 13 and a heat diffusion plate 15 are sequentially provided between the IC chip 9 and the case 3. In the following description, the positional relationship of components may be described using the right-handed rectangular coordinates in which the IC chip 9 mounted on the printed wiring board 11 faces +Z direction, and the sides of the housing 7 perpendicular to the +Z direction are defined to correspond to ±Y direction and ±X direction, in some cases. However, this coordinate system is irrelevant to directions such as up, down, left, and right when the electronic device 1 is used. For example, the electronic device 1 may be used with the +Z direction facing upward, or the electronic device 1 may be used with the +Y direction facing upward. The electronic device 1 may be used in other postures.

Figure 4:
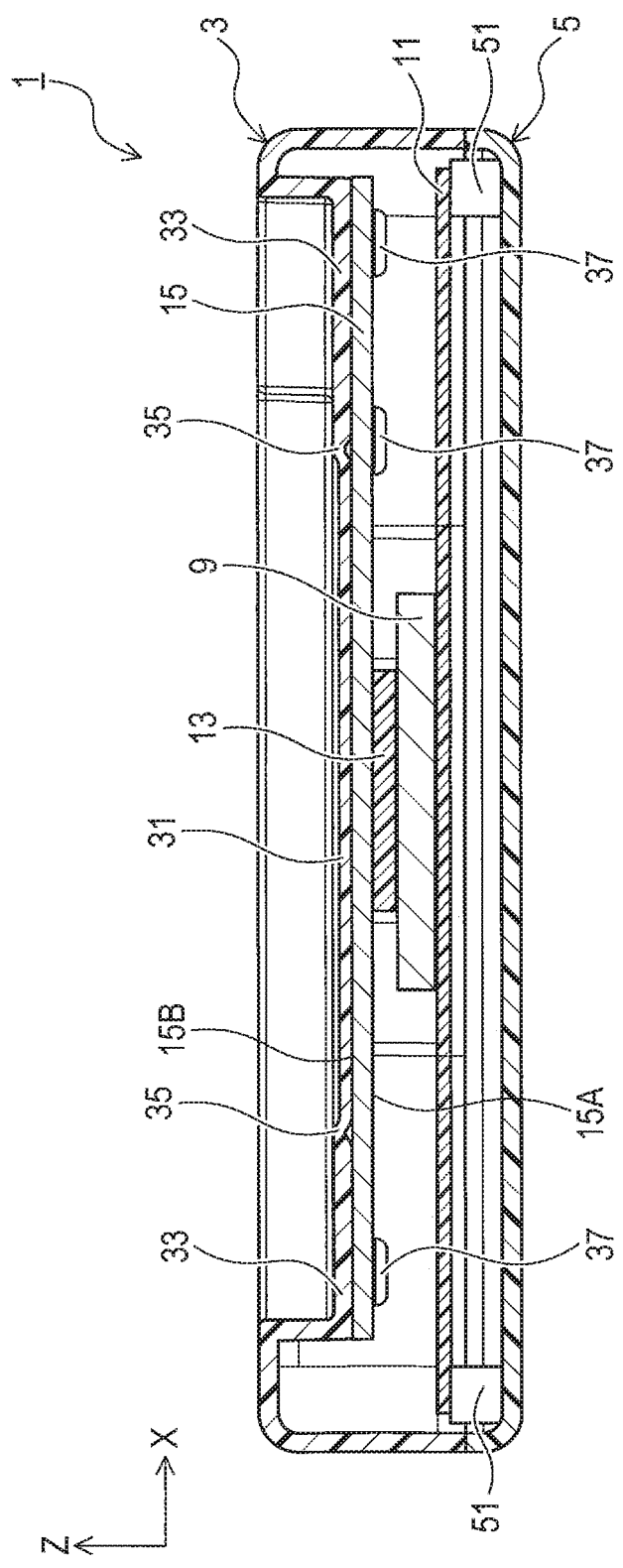
FIG. 4 is a cross-sectional view taken along a line IV-IV in FIG. 3 and illustrating the electronic device.

The case 3 includes a contact portion 31, an outer frame portion 33, a deformation portion 35, and a protrusion 37 molded integrally with resin. As shown in FIG. 4, when the heat diffusion plate 15 is mounted on the −Z side of the case 3, the contact portion 31 is able to make surface contact with the second surface 15B of the heat diffusion plate 15. The second surface 15B is a surface of the heat diffusion plate 15 opposite from the first surface 15A that is overlapped on the heat radiation gel 13. The contact portion 31 has a square plate-shaped central portion 31A having two sides parallel to the ±X direction and two sides parallel to the ±Y direction, and four flat slope portions 31B respectively connected with the four sides of the central portion 31A. The slope portion 31B is sloped to the +Z side as the distance from the central portion 31A increases. That is, the contact portion 31 has a truncated pyramid shape with the central portion 31A as the upper base.

The outer frame portion 33 surrounds the contact portion 31 with a gap from the periphery, and surrounds the printed wiring board 11 and the heat diffusion plate 15 as a part of the housing 7 from the +Z side. More specifically, as shown in FIG. 4, the outer frame portion 33 covers the printed wiring board 11 to the periphery in the ±X direction and ±Y direction, and the cover 5 covers a portion on the −Z side therefrom. In addition, a pedestal 51 is integrally molded with the cover 5 with resin. The pedestal 51 supports the printed wiring board 11 from the −Z side. Further, the outer frame portion 33 is thicker than the contact portion 31.

Figure 7:
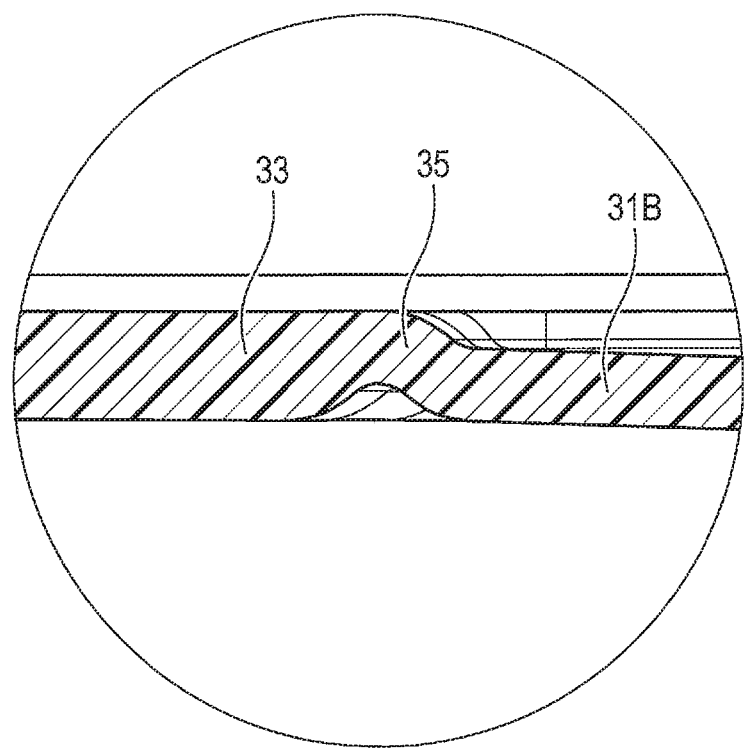
FIG. 7 is an enlarged view of a portion VII in FIG. 5 and illustrating a deformation portion of the electronic device.
Figure 8:
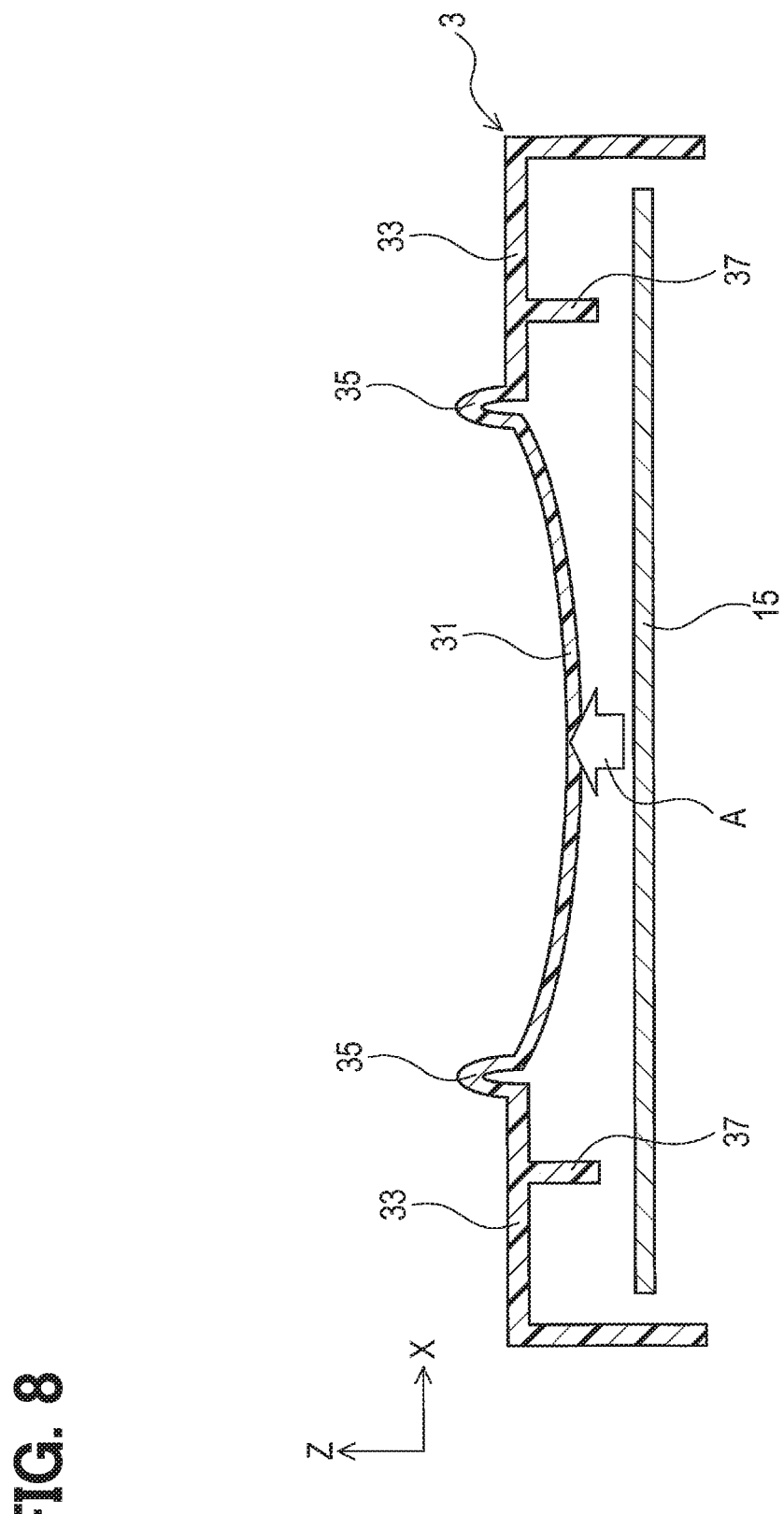
FIG. 8 is a schematic view illustrating a step of attaching a metal plate to a case.
Figure 9:
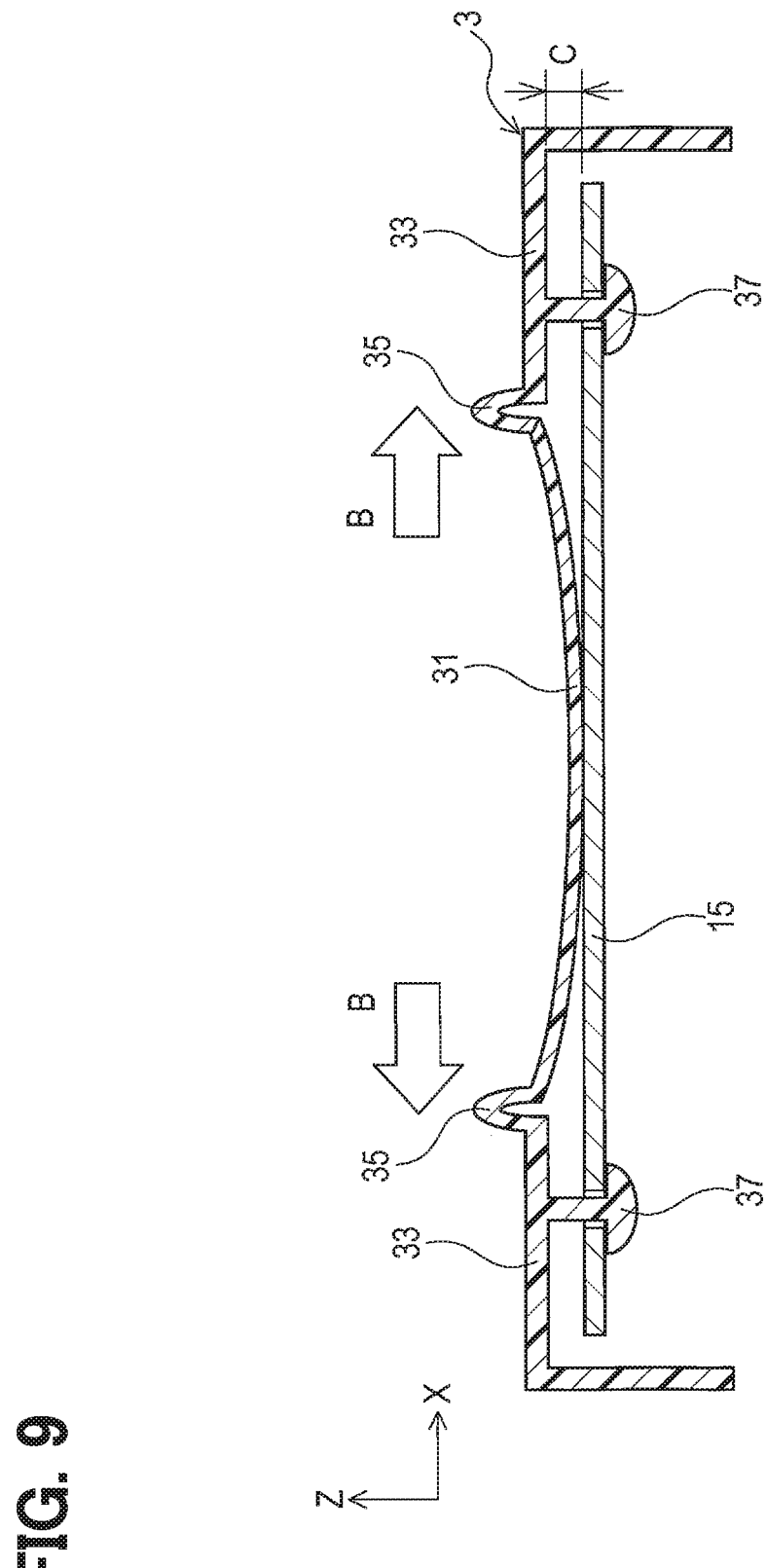
FIG. 9 is a schematic view illustrating a step after the step of FIG. 8.

The deformation portion 35 is provided between the outer frame portion 33 and the contact portion 31, and is configured to elastically deform when the contact portion 31 is pressed against the second surface 15B. Specifically, the deformation portion 35 is curved such that the side of the deformation portion 35 facing the heat diffusion plate 15 is concave between the contact portion 31 and the outer frame portion 33. Further, the deformation portion 35 is thinner than the outer frame portion 33. That is, as shown in FIGS. 7 to 9, the deformation portion 35 is curved in a U-shape such that the side facing the heat diffusion plate 15 is concave in the cross-section of the deformation portion 35 that includes a line connecting the contact portion 31 and the outer frame portion 33 at the shortest distance and that is cut perpendicularly to the heat diffusion plate 15 (that is, parallel to the Z axis).

Figure 5:
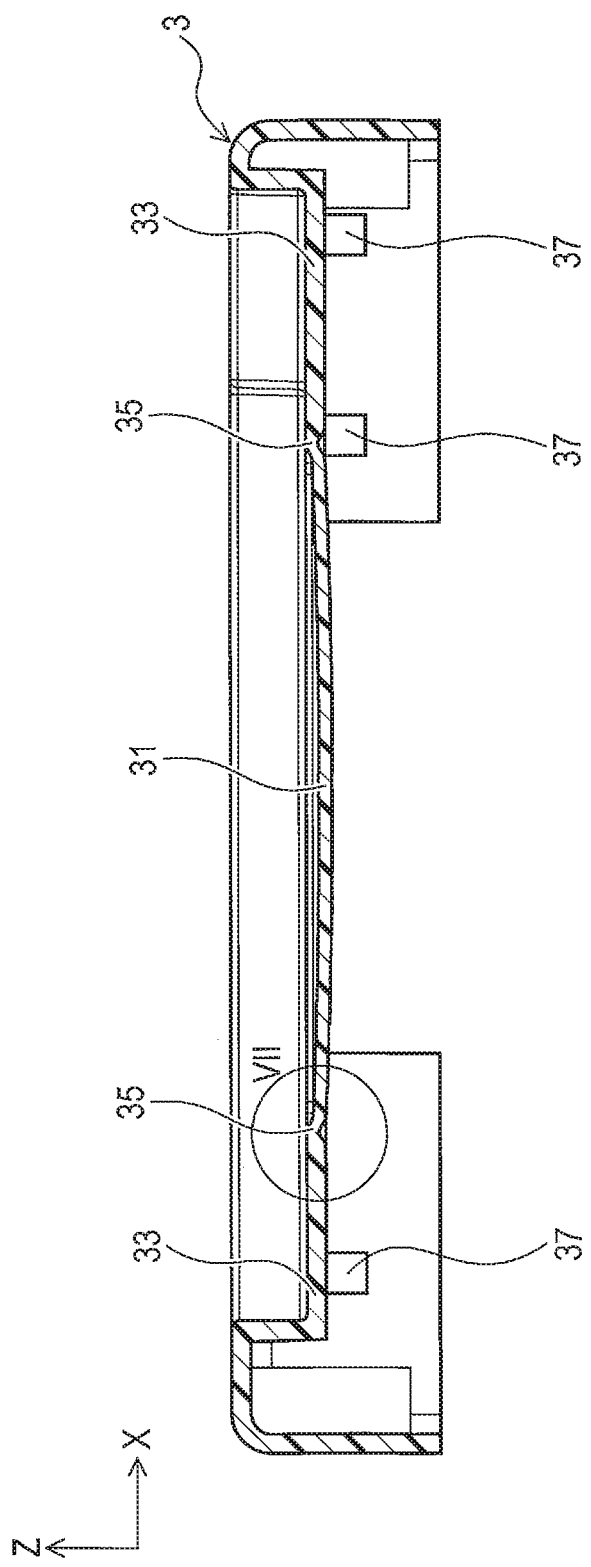
FIG. 5 is a cross-sectional view taken along a line IV-IV in FIG. 3 and illustrating a configuration of a case before assembling the electronic device.
Figure 6:
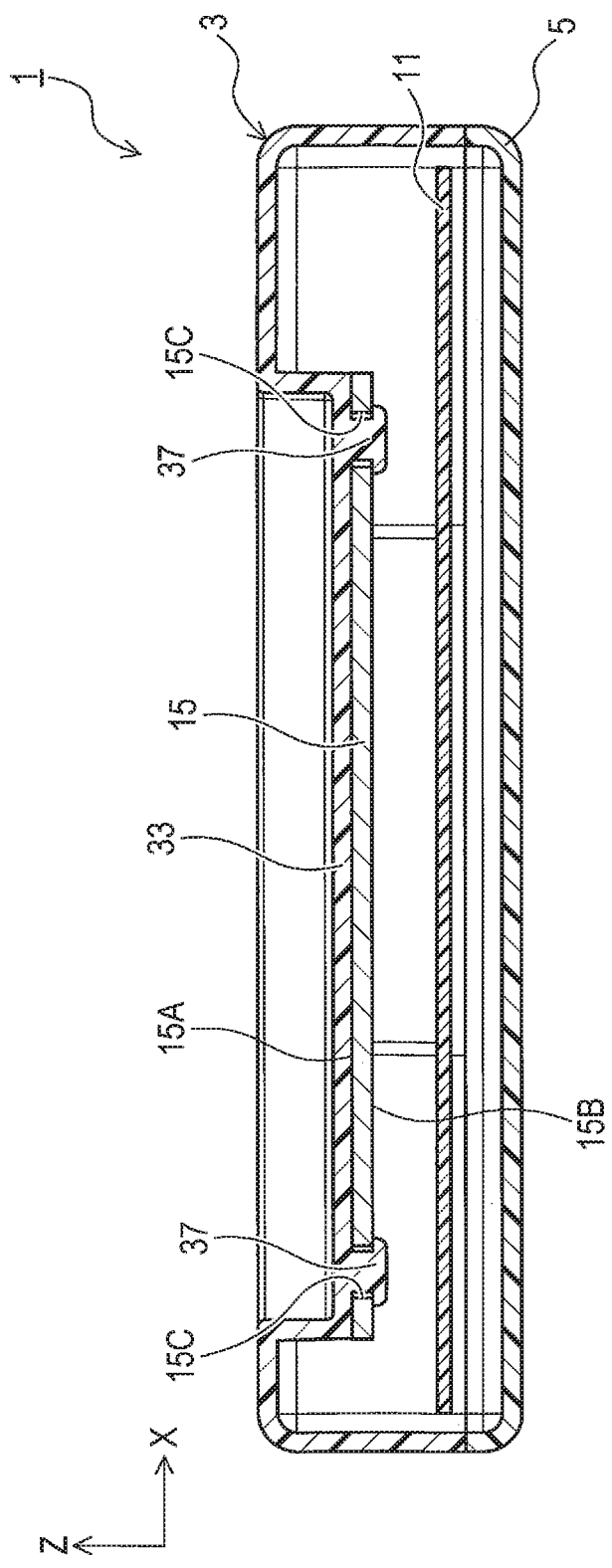
FIG. 6 is a cross-sectional view taken along a line VI-VI in FIG. 3 and illustrating the electronic device.

Plural (for example, six) protrusions 37 are provided on the −Z side surface of the outer frame portion 33 to surround the deformation portion 35. As shown in FIG. 5, the protrusions 37 are formed in a cylindrical shape when the case 3 is molded. However, when the electronic device 1 is completed, as shown in FIG. 6, the protrusions 37 pass through the through holes 15C formed in the heat diffusion plate 15 respectively, and are thermally deformed and fixed. In other words, the tip end of the protrusion 37 penetrating the through hole 15C is thermally deformed so that the protrusion 37 does not come out of the through hole 15C. By this heat caulking, the heat diffusion plate 15 is attached to the −Z side surface of the case 3.

Various thermoplastic resins can be used as the resin constituting the case 3. For example, PBT (polybutyleneterephthalate) can be used. PBT is a hard resin, but has good heat resistance. Since the inside of the housing 7 may be exposed to high temperature due to heat generated from the electronic device 1, PBT may be appropriate. Other resins may be used as the resin constituting the case 3. Various resins can be used as the resin constituting the cover 5 as in the case 3. Further, these resins generally have higher emissivity (that is, high ability to radiate heat as an electromagnetic wave to the atmosphere) than metals such as aluminum.

Various materials can be used for the heat radiation gel 13. The heat radiation gel 13 is made of a soft material having higher thermal conductivity than at least the resin constituting the case 3 or air. For example, heat conductive grease may be used as the heat radiation gel 13. A sheet-like silicone rubber or the like may be used, or another flexible heat conductive material may be used.

As the heat diffusion plate 15, an aluminum plate material may be used, or another metal plate material such as iron may be used. Further, instead of metal, a graphite plate material having high thermal conductivity along the plate surface may be used.

According to the embodiment described in detail above, the following advantages are obtained.

The first surface 15A of the heat diffusion plate 15 is overlapped with the IC chip 9 via the heat radiation gel 13. When the heat diffusion plate 15 is connected to the protrusion 37 by thermal caulking, at least a part of the contact portion 31 of the case 3 makes surface contact with the second surface 15B of the heat diffusion plate 15. At this time, as shown by the arrow A in FIG. 8, the heat diffusion plate 15 is pressed against the contact portion 31, and the contact portion 31 is subjected to a force to expand outward as shown by the arrow B in FIG. 9. However, at that time, the deformation portion 35 provided between the outer frame portion 33 and the contact portion 31 elastically deforms to absorb the force. For this reason, the outer frame portion 33 configured to constitute a part of the housing 7 surrounding the IC chip 9 and the heat diffusion plate 15 is suppressed from being deformed by the force generated by the press-contact. Therefore, it is possible to make the resin (that is, the contact portion 31) forming the housing 7 in tight contact with the heat diffusion plate 15 while reducing the dimensional tolerance of the housing 7.

For this reason, the gap between the heat diffusion plate 15 and the IC chip 9 can be designed to be small, and the heat radiation gel 13 can be made thin, so that the heat radiation to the IC chip 9 can be improved. A reason for this effectiveness will be detailed below. The gap between the heat diffusion plate 15 and the IC chip 9 is defined as A and the tolerance thereof is defined as ±B. In this case, it is necessary to satisfy A≥B in order to prevent the heat diffusion plate 15 from contacting the IC chip 9. For example, if A=B, the gap is 0 at the minimum, and the gap is 2B at the maximum. As the gap is wider, the thickness of the heat radiation gel increases and the thermal resistance also increases. When the gap dimension is 2B, the heat radiation performance is the worst. When the tolerance B is small, it becomes easy to establish the thermal design. For this reason, it is preferable to design the gap between the IC chip 9 and the heat diffusion plate 15 as small as possible with high accuracy. In the present embodiment, such a design is possible.

Since the gap between the heat diffusion plate 15 and the IC chip 9 can be designed to be small, the size of the housing 7 can be reduced, and the manufacturing cost of the electronic device 1 can be further reduced.

In this embodiment, since the case 3 and the cover 5 are made of resin, the weight of the electronic device 1 can be reduced. Also, since the case 3 and the cover 5 are made of resin, the case 3 and the cover 5 can be connected with each other using a so-called snap-fit structure. For example, when connecting a first component and a second component through the snap-fit structure, a nail (such as hook) is formed in the first component, and the nail is engaged with a notch formed on the second component, or a peripheral end of the second component, as a well-known structure for connection. When such a snap-fit structure is used, the weight of the electronic device 1 can be further reduced as compared with a case where connection is made using screw or vis.

The contact portion 31 is bent so that the side that contacts the second surface 15B of the heat diffusion plate 15 is convex. The contact portion 31 is thinner than the outer frame portion 33. Therefore, in a state where the heat diffusion plate 15 is connected to the outer frame portion 33 through the protrusion 37 by thermally caulking, when the contact portion 31 is elastically deformed, at least a part of the contact portion (for example, the entire surface of the central portion 31A facing the heat diffusion plate 15) is in surface contact with the second surface 15B. Further, the central portion 31A is pressed against the heat diffusion plate 15 and an air layer is restricted from remaining between the central portion 31A and the heat diffusion plate 15. For this reason, the heat transfer from the heat diffusion plate 15 to the case 3 is smoothed, and the heat radiation to the IC chip 9 can be further improved. Further, when the contact portion 31 makes surface contact with the second surface 15B, even if the contact portion 31 is inclined and abuts on the second surface 15B, the contact portion 31 is arranged in parallel to the second surface 15B due to the elastic deformation. Thus, deformation of the outer frame portion 33 can be suppressed.

The deformation portion 35 is elastically deformed more easily than the outer frame portion 33 by being thinner than the outer frame portion 33. That is, in the present embodiment, the rigidity of the deformation portion 35 is reduced by thinning the resin constituting the deformation portion 35. For this reason, the deformation of the deformation portion 35 is facilitated while suppressing the reduction of the waterproof property of the case 3 as compared with a case where the rigidity of the resin is reduced by making a hole in the resin constituting the deformation portion. Thus, the deformation of the outer frame portion 33 can be suppressed.

Further, the deformation portion 35 is curved such that the side facing the heat diffusion plate 15 is concave between the contact portion 31 and the outer frame portion 33. For this reason, even if a force, as indicated by the arrow B in FIG. 9, is applied to the contact portion 31 to spread outward, the deformation portion 35 is more easily deformed and absorbs the force. For this reason, the deformation of the outer frame portion 33 can be more favorably suppressed.

The heat diffusion plate 15 has the through holes 15C at positions facing the protrusions 37 formed on the outer frame portion 33. The heat diffusion plate 15 and the case 3 are connected with each other by applying heat in a state where the protrusions 37 penetrate through the through holes 15C respectively. For this reason, the electronic device 1 can be satisfactorily downsized while ensuring heat dissipation to the IC chip 9.

For example, as compared with a case where the case 3 and the heat diffusion plate 15 are connected by insert molding, there is less concern that the stress generated due to shrinkage or thermal stress during molding exceeds the allowable value of the material. Also, compared to a case where the case 3 and the heat diffusion plate 15 are connected using a snap-fit structure or a screw, the configuration provided around the case 3 and the heat diffusion plate 15 can be easily reduced in size. Further, compared with a case where the case 3 is connected to the heat diffusion plate 15 using a double-sided tape or an adhesive, a layer of substance having low heat conductivity such as air is restricted from being generated between the case 3 and the heat diffusion plate 15. Therefore, the heat dissipation to the IC chip 9 can be kept better. Also, compared to a case where the case 3 and the heat diffusion plate 15 are connected using a double-sided tape, the case 3 and the heat diffusion plate 15 can be more closely in contact with each other, and the electronic device 1 can be downsized.

In the present embodiment, the central portion 31A of the contact portion 31 is pressed against the second surface 15B of the heat diffusion plate 15, and the thermal caulking is performed from a side of the first surface 15A of the heat diffusion plate 15. Therefore, rattling of the heat diffusion plate 15 is suppressed in the ±Z direction, the ±Y direction, and the ±X direction. Thus, generation of abnormal noise due to vibration or the like is also suppressed. For example, in case where the electronic device 1 is used for an automobile, when the automobile vibrates, displacement and abnormal noise of the heat diffusion plate 15 can be suppressed.

In the present embodiment, the IC chip 9 corresponds to an electronic component. The heat radiation gel 13 corresponds to a heat conductive material. The case 3 corresponds to a resin unit. The thermally caulked protrusion 37 corresponds to a connecting unit.

Although the embodiment to implement the present disclosure has been described above, the present disclosure is not limited to the above-described embodiment, and various modifications can be made.

In the above embodiment, the contact portion 31 is bent such that the side that contacts the second surface 15B of the heat diffusion plate 15 is convex so as to make surface contact with the heat diffusion plate 15 at the central portion 31A. However, the present disclosure is not limited to this. For example, the contact portion may be curved such that the side contacting the second surface is convex. Further, in the present disclosure, "surface contact" may represent a contact state in which a predetermined contact area exists at a contact position between the contact portion and the second surface, and the width and shape of the contact area (that is, the contact surface) are not limited.

In the above embodiment, the cross-sectional shape of the deformation portion 35 is formed in a U-shape, but the shape is not limited to this. The cross-sectional shape of the deformation portion may be V-shaped, W-shaped, or bellows-shaped. Alternatively, the deformation portion may be simply formed thin. Alternatively, the deformation portion may be a remaining portion after a hole is partially formed along the periphery of the contact portion. (The rigidity of the remaining portion is lowered by the hole). The shape of the deformation portion may be other shape. For example, the cross-sectional shape may be set to suppress a displacement of the contact portion from affecting the outer frame portion. Also in that case, the deformation of the outer frame portion can be more favorably suppressed.

In the above embodiment, the protrusion 37 is thermally caulked and is used as the connecting unit, but the configuration is not limited to this. The connecting unit can be formed using various configurations such as a snap fit, an adhesive, and a double-sided tape.

In the above embodiment, the contact portion 31 and the deformation portion 35 are thinner than the outer frame portion 33, but the configurations are not limited to this. For example, the contact portion 31 may have the same thickness as the outer frame portion 33 while the deformation portion 35 is made thin. Alternatively, both the contact portion 31 and the deformation portion 35 may have the same thickness as the outer frame portion 33.

In the above embodiment, the outer shape of the contact portion 31 (that is, the shape of the deformation portion 35 as viewed in the ±Z direction) is a square, but is not limited to this. The outer shape of the contact portion may be rectangular, circular, or another shape.

A plurality of functions of one element in the above embodiment may be implemented by a plurality of elements. One function of one element may be implemented by a plurality of elements. Further, a plurality of functions of a plurality of elements may be implemented by one element. One function implemented by a plurality of elements may be implemented by one element. A part of the configuration of the above embodiments may be omitted. At least a part of the configuration of the above embodiments may be added to or replaced with the configuration of another one of the above embodiments.

What is claimed is:

1. A heat dissipation device for electronic components comprising:
    a heat diffusion plate having a first surface to overlap with an electronic component through a heat conductive material so as to diffuse heat;
    a resin unit integrally including
        a contact portion configured to at least partially make a surface contact with a second surface of the heat diffusion plate opposite from the first surface,
        an outer frame portion that surrounds the contact portion with a gap from a periphery to define a part of a housing surrounding the electronic component and the heat diffusion plate, and
        a deformation portion provided between the outer frame portion and the contact portion to elastically deform when the contact portion is pressed against the second surface; and
    a connecting unit that connects the heat diffusion plate to the outer frame portion so that at least a part of the contact portion is in surface contact with the second surface when the deformation portion is elastically deformed.

2. The heat dissipation device according to claim 1, wherein
    the contact portion is curved or bent so that a side of the contact portion in contact with the second surface is convex,
    the contact portion is thinner than the outer frame portion, and
    the contact portion is configured to elastically deform and at least a part of the contact portion comes into surface contact with the second surface when the heat diffusion plate is connected to the outer frame portion by the connecting unit.

3. The heat dissipation device according to claim 1, wherein the deformation portion is thinner than the outer frame portion.

4. The heat dissipation device according to claim 1, wherein
    the deformation portion is curved such that a side of the deformation portion facing the heat diffusion plate is concave between the contact portion and the outer frame portion.

5. The heat dissipation device according to claim 1, wherein
    the deformation portion has a cross-sectional shape that restricts a displacement of the contact portion from affecting the outer frame portion.

6. The heat dissipation device according to claim 1, wherein
    the heat diffusion plate has a plurality of through holes at positions facing the outer frame portion when the heat diffusion plate is connected to the outer frame portion by the connecting unit, and
    the connecting unit includes a plurality of protrusions formed integrally with the outer frame portion, and the plurality of protrusions are fixed by thermal deformation in a state where the plurality of protrusions pass through the plurality of through holes respectively.

* * * * *